(12) United States Patent
Boeve

(10) Patent No.: US 7,286,392 B2
(45) Date of Patent: Oct. 23, 2007

(54) DATA RETENTION INDICATOR FOR MAGNETIC MEMORIES

(75) Inventor: Hans Marc Bert Boeve, Eindhoven (NL)

(73) Assignee: NXP B.V., Eindhoven (NL)

( * ) Notice: Subject to any disclaimer, the term of this patent is extended or adjusted under 35 U.S.C. 154(b) by 33 days.

(21) Appl. No.: 10/579,934

(22) PCT Filed: Nov. 9, 2004

(86) PCT No.: PCT/IB2004/052356

§ 371 (c)(1),
(2), (4) Date: May 19, 2006

(87) PCT Pub. No.: WO2005/050664

PCT Pub. Date: Jun. 2, 2005

(65) Prior Publication Data

US 2007/0165450 A1    Jul. 19, 2007

(30) Foreign Application Priority Data

Nov. 24, 2003  (EP) .................................. 03104341

(51) Int. Cl.
  *G11C 11/00*   (2006.01)
  *G11C 11/14*   (2006.01)
(52) U.S. Cl. ...................................... 365/158; 365/171

(58) Field of Classification Search ................. 365/158
See application file for complete search history.

(56) References Cited

U.S. PATENT DOCUMENTS 7,154,798 B2 *  12/2006  Lin et al. ..................... 365/209
2006/0262585 A1 *  11/2006  Lenssen ....................... 365/53

* cited by examiner

*Primary Examiner*—Son L. Mai
(74) *Attorney, Agent, or Firm*—Peter Zawilski

(57) ABSTRACT

The present invention provides an array (20) of magnetoresistive memory elements (10) provided with at least one data retention indicator device (50). The at least one data retention indicator device (50) comprises a first magnetic element (51) and a second magnetic element (52) each having a pre-set magnetisation direction, the pre-set magnetisation direction of the first and second magnetic elements (51, 52) being different from each other. The first and second magnetic elements (51, 52) are suitable for aligning their magnetisation direction with magnetic field lines of an externally applied magnetic field exceeding a detection threshold value. According to the present invention, a parameter of the at least one data retention indicator device (50) is chosen so as to set the detection threshold value of the externally applied magnetic field to be detected. The at least one data retention indicator device (50) has a state or an output indicative of exposure of the magnetoresistive memory elements (10) of the array (20) to said externally applied magnetic field.

9 Claims, 3 Drawing Sheets

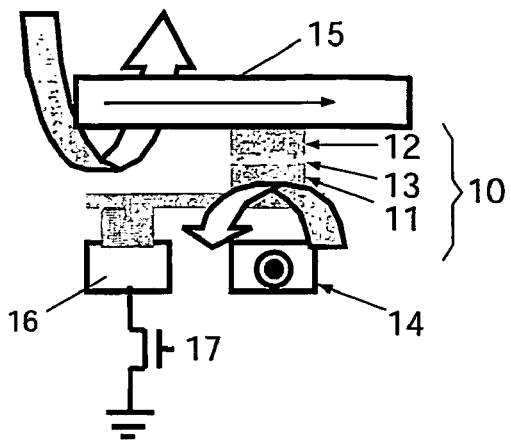
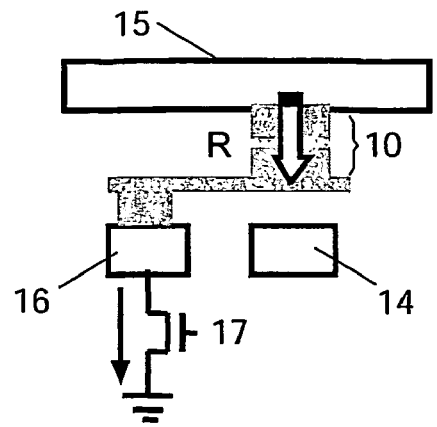
FIG.1A   FIG.1B
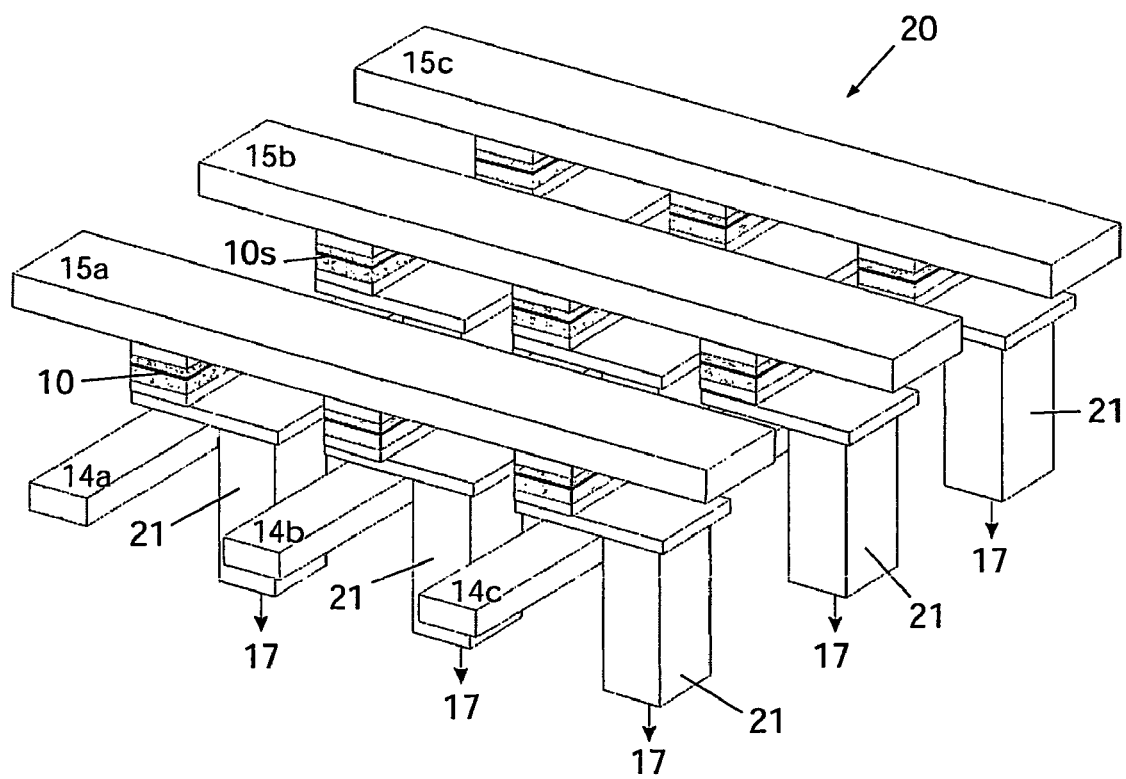
FIG.2

DATA RETENTION INDICATOR FOR MAGNETIC MEMORIES

The present invention relates to magnetic memories, e.g. magnetoresistive random access memories (MRAM), and more particularly to a method and a device to indicate data retention of such magnetic memories, and thus to indicate error-free magnetic memory performance.

Magnetic or Magnetoresistive Random Access Memory (MRAM) is currently being considered by many companies as a successor to flash memory. It has the potential to replace all but the fastest static RAM (SRAM) memories. This makes MRAM very suitable as embedded memory for System on Chip (SoC). It is a non-volatile memory (NVM) device, which means that no power is required to sustain the stored information. This is seen as an advantage over most other types of memory. MPAM memories can be used in particular for 'mobile' applications, such as smartcards, mobile phones, PDA's, etc.

The MRAM concept was originally developed at Honeywell Corp. USA, and uses magnetisation direction in a magnetic multi-layer device as information storage and the resultant resistance difference for information readout. As with all memory devices, each cell in an MRAM array must be able to store at least two binary states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR effect provide possibilities to realise a.o. non-volatile magnetic memories. These devices comprise a stack of thin films of which at least two are ferromagnetic or ferrimagnetic, and which are separated by a non-magnetic interlayer. GMR is the magneto-resistance for structures with conductor inter-layers and TMR is the magneto-resistance for structures with dielectric inter-layers. If a very thin conductor is placed between two ferromagnetic or ferrimagnetic films, then the effective in-plane resistance of the composite multi-layer structure is smallest when the magnetisation directions of the films are parallel and largest when the magnetisation directions of the films are anti-parallel. If a thin dielectric interlayer is placed between two ferromagnetic or ferrimagnetic films, tunneling current between the films is observed to be the largest (or thus resistance to be the smallest) when the magnetisation directions of the films are parallel and tunneling current between the films is the smallest (or thus resistance the largest) when the magnetisation directions of the films are anti-parallel.

Magneto-resistance is usually measured as the percentage increase in resistance of the above structures going from parallel to anti-parallel magnetisation states. TMR devices provide higher percentage magneto-resistance than GMR structures, and thus have the potential for higher signals and higher speed. Recent results indicate tunneling giving over 40% magneto-resistance, compared to 10-14% magneto-resistance in good GMR cells.

A typical MRAM device comprises a plurality of magnetoresistive memory elements 10 of which one is illustrated in FIG. 1, e.g. magnetic tunneling junction (MTJ) elements, arranged in an array. An array 20 of magnetoresistive memory elements 10 is illustrated in FIG. 2. Magnetoresistive memory elements 10 generally include a layered structure comprising a fixed or pinned hard magnetic layer 11, a free layer 12 and a dielectric barrier 13 in between. The pinned layer 11 of magnetic material has a magnetic vector that always points in the same direction. The free layer 12 is used for information storage. The magnetic vector of the free layer 12 is free, but constrained within the easy axis of the layer 12, which is determined chiefly by the physical dimensions of the magnetoresistive memory element 10. The magnetic vector of the free layer 12 points in either of two directions: parallel or anti-parallel with the magnetisation direction of the pinned layer 11, which coincides with the said easy axis. The fundamental principle of MRAM is the storage of information as binary data, e.g. as "0" and "1", based on directions of magnetisation. This is why the magnetic data is non-volatile and will not change until it is affected by an external magnetic field.

Storing or writing data into a magnetoresistive memory element 10 is accomplished by applying magnetic fields and thereby causing magnetic material in the free layer 12 to be magnetised into either of two possible memory states. When both magnetic layers 11, 12 of the layered structure of a magnetoresistive memory element 10 are magnetised with the same orientation (parallel), the data is either of two binary values, e.g. "0", otherwise, if both magnetic layers 11, 12 of the layered structure of the magnetoresistive memory element 10 are magnetised with inverse orientation (anti-parallel), the data is the other binary value, e.g. "1". The magnetic fields are created by passing currents through current lines (word lines 14, 14a, 14b, 14c and bit lines 15, 15a, 15b, 15c) external to the magnetic structures. It is to be noted that two magnetic field components are used to differentiate between a memory element 10s and other non-selected memory elements 10.

Reading data is accomplished by sensing resistance changes in a magnetic memory element 10 when magnetic fields are applied. Making use of the fact that the resistance of the layered structure 11, 12, 13 varies depending on whether or not the magnetic orientations are parallel, the system can discriminate both binary values of the data, e.g. "0" or "1". The magnetic fields required for readout are created by passing currents through word lines external to the magnetic structures, or through the magnetic structures themselves (via bit line 15 and sense lines 16). Reading of a selected memory element 10s is done through a series transistor 17 connected to a via 21 to avoid sneak currents through other memory elements 10.

The most common MRAM design is the type 1T1MTJ (1 transistor 17 per 1 MTJ cell 10), as illustrated in FIG. 1. A memory array 20 comprising a plurality of magnetoresistive memory elements 10 comprises orthogonal bit lines 15a, 15b, 15c and word lines 14a, 14b, 14c patterned separately into two metal layers respectively under and above the magnetoresistive memory elements 10, in the present example magnetic tunnel junction (MTJ) stacks. The bit lines 15a, 15b, 15c are parallel with the hard axis of the memory elements 10, which creates a field in the easy axis, while the word lines 14a, 14b, 14c otherwise create a field in the hard axis. In some designs the relations can be reversed, i.e. the bit lines 15 may create a hard axis field and the word lines 14 may create an easy axis field. Writing on a selected memory element $10_s$ is done by simultaneously applying current pulses through the respective bit line 15b and word line 14a that intersect at the memory element $10_s$. The direction of the resultant field makes an angle of 45° with respect to the easy axis of the free layer 12 of the memory element $10_s$. At this angle, the switching field of the free layer 12 is the smallest, thus writing can be done with the least current.

The switching curve of an MRAM element can be represented by its so-called astroid curve 30, 31 as shown in FIG. 3. The astroid curves 30, 31 unambiguously separate switching and non-switching events for different time periods. Astroid curve 30 is a curve illustrating 10 year stability for non-selected memory elements 10, and astroid curve 31 is a curve illustrating 10 ns stability for non-selected memory elements 10. In other words, if a magnetic field is being applied within the astroid 30, 31, magnetic memory elements 10 will not switch and maintain in their state for 10 years, respectively 10 ns, whereas fields exceeding the astroid 30, 31 may switch the memory element 10, if the previous state were the opposite one. Therefore, only if two magnetic field components are present, the bit state of a memory element 10 can be switched.

If the magnitudes of the magnetic fields generated by either word line 14 or bit line 15 are the same, the direction of the resultant magnetic field makes an angle of 45° with respect to the easy axis of the free layer 12 of the selected element $10_s$. At this angle, the switching field of the free layer 12 is the smallest, as shown by the astroid curve 30, 31 in FIG. 3, thus writing can be done with the least current.

On the one hand, the currents in the selected bit line 15b and word line 14a must be chosen in such a way that the total magnetic field sufficiently exceeds the switching field of the selected memory element $10_s$ at 45° with the easy axis, or in other words, so that the end of the resultant field vector 32 is on or outside the astroid 30, 31 in this direction (see FIG. 3). On the other hand, the magnitude of the field created by the selected bit line 15b must be significantly smaller than the switching fields in the easy axis direction EA of any of the memory elements 10 lying on the same bit line 15b to prevent undesired over-writing. Also, the magnitude of the field created by the selected word line 14a must be significantly smaller than the switching fields in the hard axis direction HA of any of the memory elements 10 lying on the same word line 14a to prevent undesired over-writing.

FIG. 3 also illustrates stable write field windows 33, i.e. if a resultant magnetic field vector 32, obtained by applying a first current through a selected bit line 15 and a second current through a selected word line 14, falls within such write field window 33, it may switch the magnetic state of the selected memory element $10_s$ if the previous state were the opposite one, but non-selected memory elements 10 located along one of the selected word or bit lines 14, 15 will not switch states.

For arrays 20 of memory elements 10, a statistical interpretation is given to the astroid curve 30, 31. In other words, a standard deviation parameter σ can be assigned to the astroid curve 30, 31 which represents a Gaussian-like switching field distribution.

A one-dimensional representation of the switching field distribution is as represented in FIG. 4. As an example, the distribution of logic '0' values is shown on the left hand side of the drawing in graph 40, and the distribution of logic '1' values is shown on the right hand side of the drawing in graph 41. Both distributions have a standard deviation parameter σ, which for simplicity is assumed the same for both logic values. It is however to be noted that, in practice, the standard deviation parameter σ does not need to be the same for both distributions.

It is a disadvantage of MRAM cells, and of magnetic memories in general, that an intentional or unintentional exposure to strong magnetic fields makes them vulnerable. Very high density MRAM arrays 20 are particularly sensitive to magnetic fields mainly because the minuscule magnetoresistive memory elements 10 require relatively low magnetic fields for read/write operations which depend upon the switching or sensing of magnetic vectors in the free layers 12. These magnetic vectors are, in turn, easily affected and may have their magnetic orientation changed by such external magnetic fields. The dashed lines 42 in FIG. 4 visualise the maximum field range that would be allowed for bit stability, in view of the switching field distribution of the logic '0' and '1' values. In other words: if the maximum external field exceeds these limits, at least some of the data stored in the memory elements may be changed.

A solution would be to shield the memory elements from any external field. However, also shielding has its limits so that, always, a higher magnetic field can be applied which will cause an external magnetic field in the vicinity of the data layer, and which will have potential consequences with respect to data retention.

Therefore, it would be desirable to detect whether a certain magnetic field threshold is exceeded, for which data integrity in the magnetic memory array can not be guaranteed.

In order to solve this problem, a specific magnetic field sensor can be designed and integrated on-chip, which sensor is able to detect any magnetic field threshold. However, adding this functionality would lead to extra costs, e.g. due to extra mask steps during manufacturing of the memory device.

It is an object of the present invention to provide a magnetic field sensor for indicating data retention of an array of magnetic memory elements, without substantially introducing extra costs with respect to the manufacturing costs of the memory array.

The above objective is accomplished by a method and device according to the present invention.

The present invention provides an array of magnetoresistive memory elements provided with at least one data retention indicator device. The at least one data retention indicator device comprises a first magnetic element and a second magnetic element each having a pre-set magnetisation direction, the preset magnetisation direction of the first and second magnetic elements being different from each other. The first and second magnetic elements are suitable for aligning their magnetisation direction with magnetic field lines of an externally applied magnetic field exceeding a detection threshold value. According to the present invention, a parameter of the at least one data retention indicator device is chosen so as to set the detection threshold value of the externally applied magnetic field to be detected. The at least one data retention indicator device has a state or an output indicative of exposure of the magnetoresistive memory elements of the array to said externally applied magnetic field.

The parameter may comprise the geometry of the device, i.e. it may include any or a combination of the shape, size and aspect ratio of the first and second magnetic elements.

The first and second magnetic elements may comprise MRAM cells. The MRAM cells have a free magnetic layer, and according to the present invention the MRAM cells may have pre-set inverse magnetisation directions of their free magnetic layer.

The at least one data retention indicator device may be built adjacent to the magnetic memory elements of which the data retention has to be indicated. A plurality of data retention indicator devices may be spatially distributed amongst the magnetic memory element in the array.

The present invention also provides an integrated circuit comprising an array of magnetic memory elements according to the present invention. The integrated circuit may furthermore comprise a control circuit for generating an error signal upon indication by any of the at least one data retention indicator devices of exposure of the array to an externally applied magnetic field exceeding the detection threshold value.

The present invention furthermore provides a method for indicating data retention of an array of magnetic memory elements. The method comprises changing a preset magnetisation direction of a magnetic data retention indicator device when the array is exposed to an external magnetic field exceeding a pre-set magnetic field threshold voltage.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 1(a) illustrates the MRAM write principle and FIG. 1(b) illustrates the MRAM read principle.

FIG. 2 is a perspective view of a known 1T1MTJ MRAM design comprising a plurality of memory elements and perpendicular bit lines and word lines. Magnetic tunnel junctions (MTJ) are placed at the intersection regions of the bit lines and word lines. The bottom electrodes of the MTJs are connected to selection transistors with vias, which are used when reading the memory elements.

Figure 3:
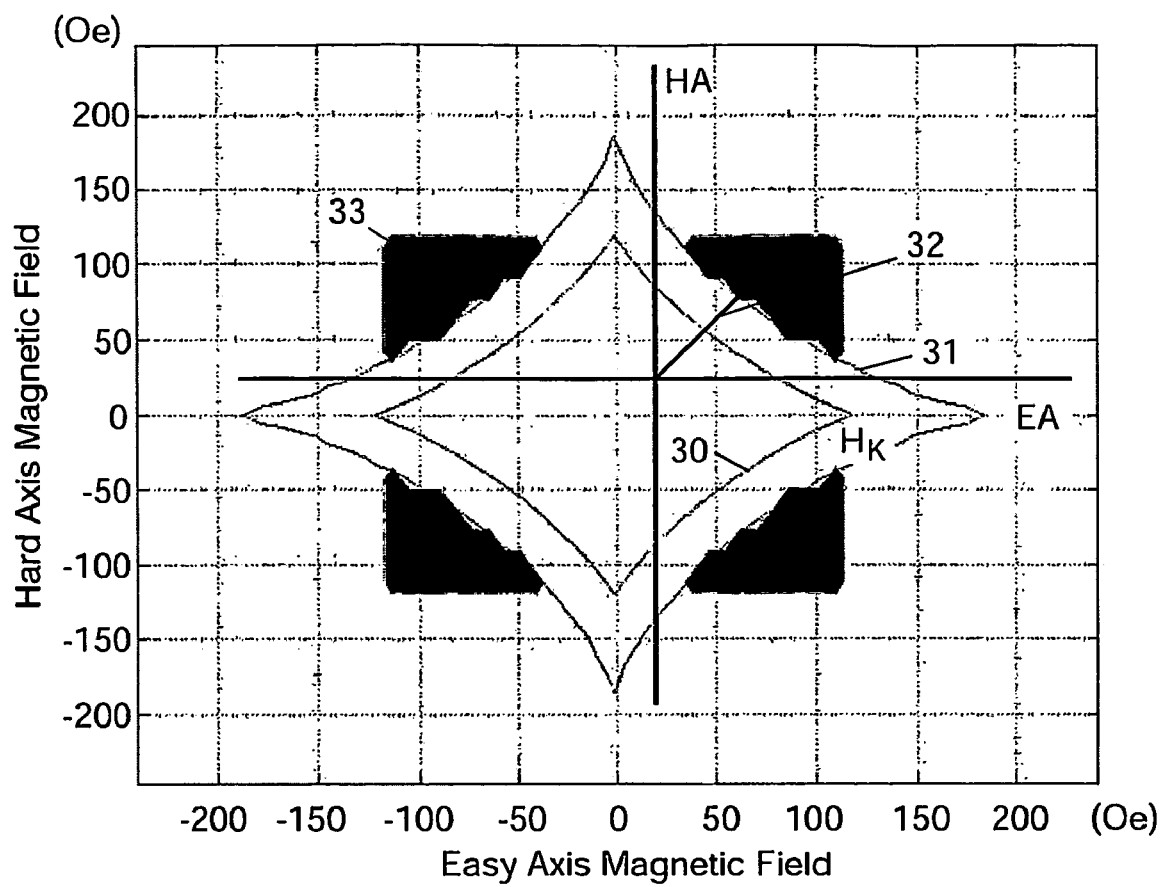
FIG. 3 illustrates an astroid curve showing criteria for robust write operation in MRAM, resulting in stable write field windows.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

According to the present invention, an array (not represented in the drawings) of magnetic memory elements having a data content is provided, which array is provided what least one data retention indicator device 50 comprising a first magnetic element 51 and a second magnetic element 52.

The array of magnetoresistive memory elements is logically organised in rows and columns. Throughout this description, the terms "horizontal" and "vertical" are used to provide a co-ordinate system and for use of explanation only. They do not need to, but may, refer to an actual physical direction of the device. Furthermore, the terms "row" and "column" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms will be interchangeable. Also, non-Cartesian arrays may be constructed and are included within the scope of the invention. Accordingly the terms "row" and "column" should be interpreted widely. To facilitate in this wide interpretation, the terminology "logically organised in rows and columns" is used. By this is meant that sets of memory elements are linked together in a topologically linear intersecting manner; however, that the physical or topographical arrangement need not be so. For example, the rows may be circles and the columns may be radii of these circles and the circles and radii are described in this invention as "logically organised" in rows and columns. Also, specific names of the various lines, e.g. bit line and word line, or row line and column line, are intended to be generic names used to facilitate the explanation and to refer to a particular function and this specific choice of words is not intended in any way to limit the invention. It should be understood that all these terms are used only to facilitate a better understanding of the specific structure being described, and are in no way intended to limit the invention.

Figure 5:
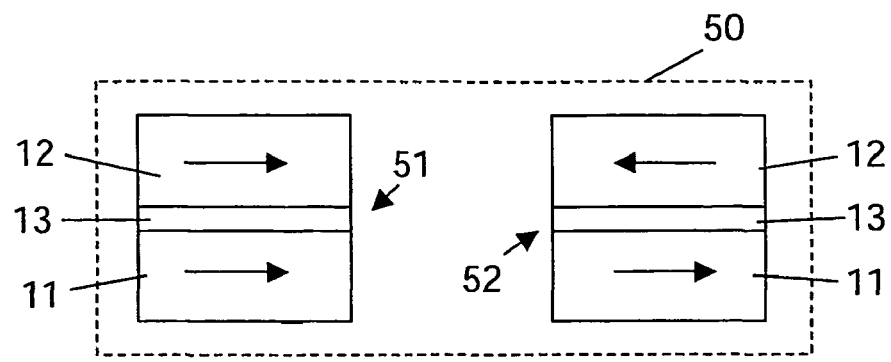
FIG. 5 is a schematic illustration of a side view of a data retention indicator device according to an embodiment of the present invention.

According to the present invention, the data retention indicator device 50 comprises two inversely magnetised or biased magnetic elements 51, 52. According to a first embodiment of the present invention, these inversely binary magnetised or biased magnetic elements 51, 52 may be formed by discrete magnetic elements, e.g. by a combination of two associated MRAM cells with inversely or differently polarised magnetisation directions as shown in FIG. 5. With inverse magnetization directions is meant that each element 51, 52 has at least two stable or quasi-stable magnetization directions, and the two elements 51, 52 are arranged so that the magnetization direction of one element 51 is reversed with respect to the other element 52. The magnetization direction of each element 51, 52 can be set independently, or both magnetization directions can be set in one go. For example, the free layers 12 of the associated MRAM elements 51, 52 are inversely polarized, i.e. if the free layer 12 of the fist MRAM element 51 is polarized in one direction, the free layer 12 of the second MRAM element 52 is polarized in an opposite direction. For example, the first MRAM element 51 may have parallel magnetization directions of its pinned layer 11 and its free layer 12 and the second MRAM element 52 may have anti-parallel magnetization directions of its pinned layer 11 and free layer 12, as shown in FIG. 5. The pinned layers 11 of the associated MRAM elements 51, 52 both have the same magnetization direction in the example represented, while the free layers 12 have different magnetization directions. Alternatively, pinned layers 11 of the associated MRAM elements 51, 52 may have opposite magnetization directions (not represented in the drawings). As, according to the present embodiment, the free layers 12 of the associated MRAM elements also have inverse magnetization directions with respect to each other, either the pinned layer 11 and the free layer 12 of both the first and second MRAM element 51, 52 may be inversely polarized or the pinned layer 11 and the free layer 12 of both the first and second MRAM element 51, 52 may have a parallel polarization.

A data retention indicator device 50 according to the present invention may be incorporated in an array of MRAM elements adjacent the MRAM elements of which data retention has to be indicated.

Because of the small dimensions of the MRAM elements in an array and the high density thereof, exposure to an external magnetic field may result in changes to the magnetization directions of the elements. In particular the cell-pair-wise opposed magnetization directions of the MRAM elements are disturbed and a parallel orientation of the magnetization directions of free layers 12 of neighboring MRAM elements is produced. This parallel orientation may be along the direction of the external magnetic field, when present. The remanent state will be a parallel orientation of the magnetization directions of free layers 12 of neighboring MRAM elements. The data retention indicator device 50 as described in accordance with an embodiment of the present invention, is based on the above described principle. However, the present invention is not limited to this embodiment.

When the data retention indicator device 50 is exposed to an external magnetic field that is large enough to trigger the device, the magnetization direction of the magnetic elements 51, 52 of the data retention indicator device 50 will all be changed so as to point more into the direction of the externally applied magnetic field. The effective change of the magnetization direction of the magnetic elements 51, 52 gradually increases with increasing external magnetic field. According to the first embodiment of the present invention, the magnetization direction of the free layer 12 of one of the MRAM elements 51, 52 of the data retention indicator device 50 will be changed permanently, if the externally applied magnetic field exceeds a pre-set threshold value, for which threshold value particular magnetic elements 51, 52 of the data retention indicator device 50 are manufactured. Magnetization vectors of the free layers 12 will all point in the same direction, when the external magnetic field is no longer present. Through this, both LAM elements 51, 52 of the data retention indicator device 50 now have parallel magnetization directions.

It is known that parallel and anti-parallel configurations of MRAM elements 51, 52 have different resistances. The resistance of an MRAM element 51, 52 is either low or high dependent on the relative polarization, parallel or anti-parallel, of the free layer 12 with respect to the pinned magnetic layer 11. Therefore, by measuring the resistance difference of both MRAM elements 51, 52 of the data retention indicator device 50, their mutual magnetization direction can easily be determined. For the embodiment shown in FIG. 5, a significant resistance difference indicates a normal situation, i.e. one of the MRAM elements 51 being in parallel configuration and the other MRAM element 52 being in anti-parallel configuration, which means the array of MRAM elements has not been exposed to an external magnetic field exceeding the threshold value for which the MRAM elements 51, 52 are made. No substantial resistance difference between both MRAM elements 51, 52 of the data retention indicator device 50 indicates that both MRAM elements 51, 52 have equally polarized magnetization directions and thus has been exposed to an external magnetic field, which has changed the magnetization direction in the free layer 12 of at least one of the MRAM elements 51, 52 of the data retention indicator device 50. Alternatively, according to any of the embodiments, not represented in the drawings, with inversely polarized pinned magnetic layers, no resistance difference between both MRAM-cells of the data retention indicator device indicates a normal situation, and a significant resistance difference between both MRAM-cells of the data retention indicator device indicates that the data retention indicator device, and thus at least part of the memory array has been exposed to an external magnetic field exceeding a threshold value.

In this way, by determining the polarization directions of both magnetic elements of the data retention indicator device 50, it can be detected whether the magnetic memory array has been under the influence of a too large external magnetic field, which results in data retention of the magnetic memory not being guaranteed.

An IC wherein at least one data retention indicator device 50 according to the present invention is present, can regularly check the polarization direction, e.g. the resistance, of the magnetic elements 51, 52 of the data retention indicator device 50 during operation. Upon detection of a same polarisation direction for the free layers 12 of both magnetic elements 51, 52 of the data retention indicator device 50, e.g. by measuring a resistance difference or a same resistance of two MRAM elements 51, 52, depending on the configuration thereof, and hence upon detection of exposure to an external magnetic field exceeding a threshold value, the IC can, dependent on what is desirable for the specific application, erase the data of all MRAM elements of the array, or can reset itself or block its function.

In a further embodiment of the present invention a number of data retention indicator devices 50 according to the present invention are spatially distributed amongst the MRAM elements of the array.

The present invention provides a data retention indicator device 50 to detect exposure to external magnetic fields that exceed a threshold value, which data retention indicator device 50 can easily be added to an embedded or stand-alone MRAM array. Especially in applications where integrity of data is crucial, e.g. program code of the operation system in embedded MRAM in SoC, the use of a data retention indicator device 50 according to the present invention may be of importance. Moreover, it provides a detection for unintentional exposure to an external magnetic field, e.g. from a permanent magnet or from write equipment for the magnetic strip on a smartcard. The invention can also reduce the need for implementing very good magnetic shielding in MRAM ICs, since unintentional exposure to a large field, which is rare in normal use, can now be detected.

The threshold magnetic field as from which data retention cannot be guaranteed can be tuned by proper choice of geometry of the magnetic elements 51, 52 of the data retention indicator device 50. In the ideal case, the astroid curve of each of the magnetic elements 51, 52 is mainly set by two parameters: the shape anisotropy, and the total coupling field from pinned layer 11 to free layer 12.

For small magnetic tunnel junctions, as typically used today, the determining anisotropy term in the energy balance is set by the shape, leading to an anisotropy field $H_K$, representative for the size of the astroid curve. In the ideal case, the astroid curve will reach the reference easy and hard axis at the field $H_K$ (FIG. 3).

In essence, the shape anisotropy is inversely proportional to the minimal dimension w (width) and proportional the aspect ratio AR of the device (AR=1/w, 1=length). Also the shape itself of the magnetic element 51, 52 has some influence, e.g. elliptic or diamond shape elements. As this can be implemented for any shape, shape will not be considered explicitly in the present disclosure. It lies within the skills of a person skilled in the art to calculate the anisotropy field for any shape.

For an ellipse, the anisotropy field $H_K$ is found to be $$H_K = 4\pi(t.M)(\eta_y - \eta_x)/w,$$

with (t.M) the product of free layer 12 thickness t and saturation magnetization M, and $(\eta_y - \eta_x)$ a monotonously increasing function of the aspect ratio AR=1/w with value 0 for 1/w being 1 (circular) and with value 1 for 1/w being ∞.

Figure 4:
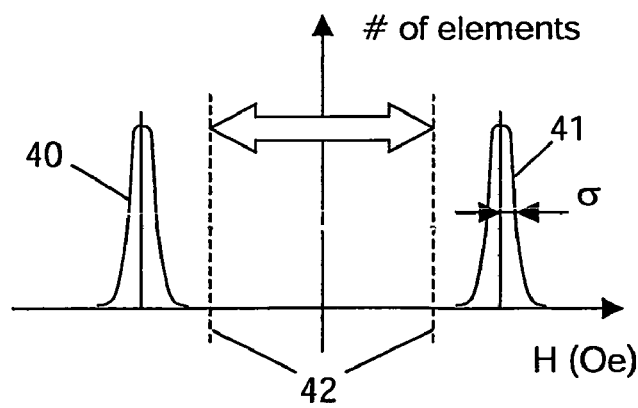
FIG. 4 illustrates magnetic field distribution for an array of magnetoresistive memory elements, with representative standard deviation parameter σ.

The coupling field between pinned layer 11 and free layer 12 may lead to a shift of the astroid curve 31 along the easy axis EA. Ideally, this shift is not present, so that the switching fields for '0' and '1' are symmetrical with respect to the origin (FIG. 4). The coupling field is the sum of two different components: Néel coupling, and magnetic stray-field coupling. The Néel coupling does not depend on the geometry, and is therefore fixed. The magnetic stray-field coupling however is defined by the geometry as the magnetic stray-field coupling $H \sim w^\alpha/1$, with $\alpha$ approximately equal to 0.2.

In order to design $1^{st}$ and $2^{nd}$ magnetic elements 51, 52 of the data retention device 50 with a pre-set threshold magnetic field value, the method described hereinafter can be used. As an example, it is desired to detect any magnetic field applied to the memory array, which exceeds a threshold value of 6.$\sigma$ below the average switching field of the MRAM elements in the array. For a Gaussian distribution, this would mean that only 1 in $10^9$ elements would switch under this limit. Depending on the effective switching field distribution, this field can be calculated, and used as target threshold field value for the data retention indicator devices 50. Also for the data retention indicator device 50, a statistical distribution in the switching threshold can be taken into account.

The proper choice of the geometry, primarily given by the length 1 and width w, can then be found by mapping the astroid curve that is mainly defined by the shape anisotropy of the magnetic elements 51, 52 on the required threshold curve. At the same time, one tries to obey the symmetry of the astroid curve by cancellation of the Néel coupling by the stray-field coupling, for a given magnetic tunnel junction stack from the memory cells in the MRAM array. The first criterion is the most important. The latter one may be more relaxed and may lead to a slight asymmetry in the astroid curve of the data retention indicator device 50. As long as the asymmetry is smaller than other margins such caused by e.g. process parameters, this may be allowed.

For clarification purposes only, the following numerical example is given. In a magnetoresistive element, the free layer 12 is a NiFe layer with a thickness of 5 nm, and the pinned layer is an artificial anti-ferromagnetic stack (AAF) comprising IrMn/CoFe/Ru/CoFe with a respective thickness of the CoFe layers of 3 nm and 2.65 nm. As indicated, one of the CoFe layers is pinned to a natural antiferromagnetic layer of IrMn. The size of the elements in the magnetoresistive memory array is chosen to be 200×100 nm².

The magnetic multilayer is described with N magnetic layers using a modified Stoner-Wohlfarth approach, where each layer is denoted by a magnetization angle $\theta_i$, as well as parameters such as layer thickness, saturation magnetization, magneto-crystalline anisotropy, size and geometry. The interlayer coupling between adjacent ferromagnetic layers can be represented by an interfacial energy $J_i$. The total energy of the system can be calculated as the sum of different energy terms for the different layers, magnetocrystalline anisotropy $E_A$, external Zeeman energy $E_H$, and demagnetization energy $E_S$, plus the coupling energy at the different interfaces.

$$E_{Tot} = \sum_{i=1}^{N}(E_A + E_H + E_S) + \sum_{i=1}^{N-1} E_I$$

In static equilibrium calculations, the set of magnetization directions of the different layers can be found as (local) minima after solving the N-dimensional optimization problem. The equilibrium configurations are given by the set of N coupled equations $$\frac{\partial E_{tot}}{\partial \theta_i} = 0 \quad i = 1 \ldots N$$

with the stability condition that all the eigenvalues of the matrix M should be positive:

$$M_{ij} = \frac{\partial^2 E_{tot}}{\partial \theta_i \partial \theta_j}$$

Typical values for the coupling are as follows:
IrMn—CoFe −0.25 mJ/m²
CoFe—CoFe −0.90 mJ/m²
CoFe—NiFe +0.01 mJ/m²

Figure 6:
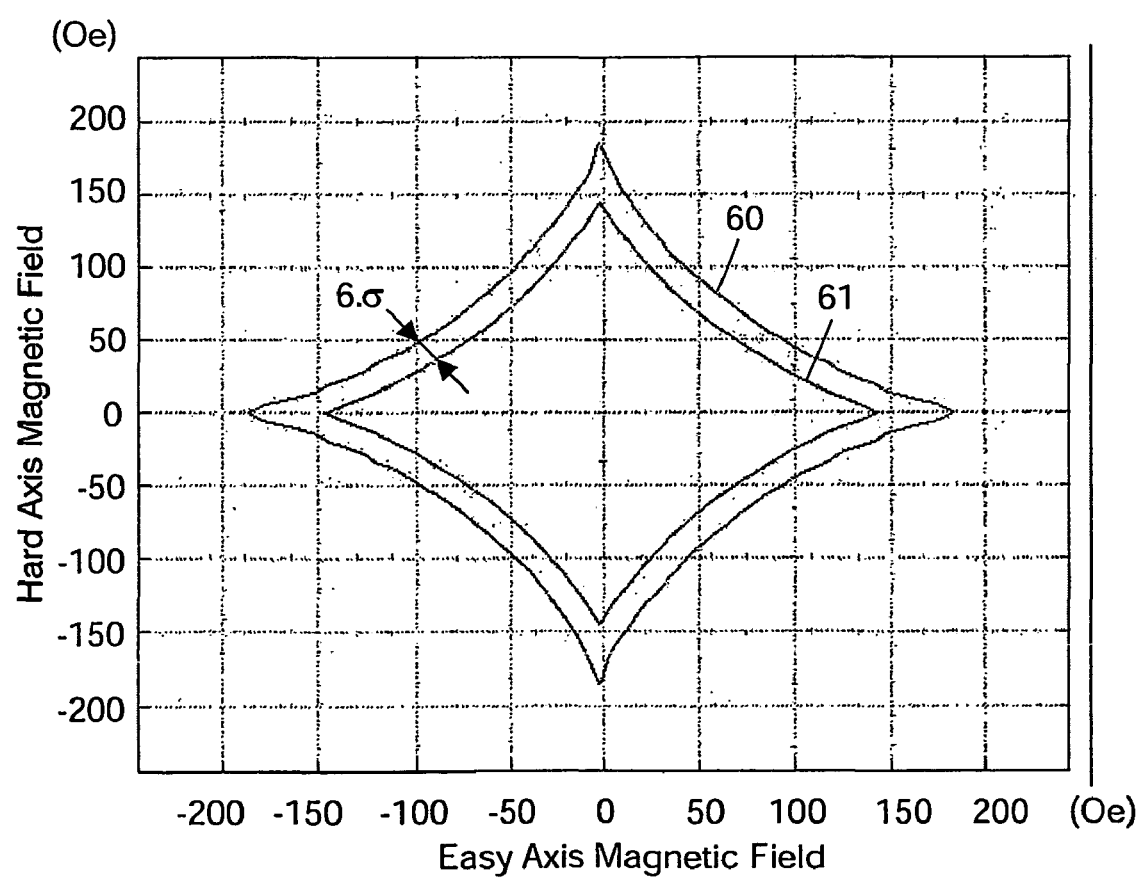
FIG. 6 shows switching fields of MRAM elements, taking into account process variations.

From a calculation, the switching field for the ideal case can be found, i.e. for $\sigma=0$, or thus in case there would not be any process variations, which switching field can be labeled as the so-called 'average' switching field taking into account process variations. The average switching field is shown in FIG. 6 by the curve 60. A certain value for $\sigma$ is assumed, which can be deduced from experimental data, measurements on a plurality of memory elements processed with the same processing. In this example, it is assumed that, inside the astroid curve 60, the 6.$\sigma$ criterion is shown as the curve 61, which corresponds to, as can be found from a calculation with different geometry, the expected curve for a device of 280×150 nm². It can thus be seen what happens if the geometry is being changed to largers elements, with slightly smaller aspect ratio. Taking into account the possible influence of process variations on the data retention indicator device 50 itself, one may opt to scale a little further, e.g. to 300 ×160 nm², or 320×180 nm². It is to be noted that the aspect ratio decreases with the size of the detection device in order to keep the symmetry in this detection device.

Any external magnetic field that may cause a reversal in one of the bits stored in a magnetic memory element of the array will cause switching in at least one of the pre-set magnetic detection elements 51, 52 of the data retention indicator device 50, as long as both alignments are part of this set of elements 51, 52. Moreover this information will be remembered by these elements 51, 52, as they keep their memory state without having to apply any external power.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An array (20) of magnetoresistive memory elements (10) provided with at least one data retention indicator device (50) comprising a first magnetic element (51) and a second magnetic element (52) each having a pre-set magnetisation direction, the pre-set magnetisation direction of the first and second magnetic elements (51, 52) being different from each other, the first and second magnetic elements (51, 52) being suitable for aligning their magnetisation direction with magnetic field lines of an externally applied magnetic field exceeding a detection threshold value, wherein a parameter of the at least one data retention indicator device (50) is chosen so as to set the detection threshold value of the externally applied magnetic field to be detected, the at least one data retention indicator device (50) having a state or an output indicative of exposure of the magnetoresistive memory elements (10) of the array (20) to said externally applied magnetic field.

2. An array (20) according to claim 1, wherein the parameter includes any or a combination of the shape, size and aspect ratio of the first and second magnetic elements (51, 52).

3. An array (20) according to claim 1, wherein the first and second magnetic elements (51, 52) comprise MRAM cells.

4. An array (20) according to claim 3, the MRAM cells having a free magnetic layer (12), wherein the MRAM cells have pre-set inverse magnetisation directions of their free magnetic layer (12).

5. An array (20) according to claim 1, wherein the at least one data retention indicator device (50) is built adjacent to the magnetic memory elements (10) of which the data retention has to be indicated.

6. An array (20) according to claim 1, there being a plurality of data retention indicator devices (50) spatially distributed amongst the magnetic memory element in the array (20).

7. An integrated circuit comprising an array (20) of magnetic memory elements (10) according to claim 1.

8. An integrated circuit according to claim 7, furthermore comprising a control circuit for generating an error signal upon indication by any of the at least one data retention indicator devices (50) of exposure of the array to an externally applied magnetic field exceeding the detection threshold value.

9. A method for indicating data retention of an array (20) of magnetic memory elements (10), the method comprising changing a pre-set magnetisation direction of a magnetic data retention indicator device when the array is exposed to an external magnetic field exceeding a pre-set magnetic field threshold voltage.

* * * * *